United States Patent
Siemieniec et al.

(10) Patent No.: US 9,653,598 B2
(45) Date of Patent: May 16, 2017

(54) TRANSISTOR COMPONENT

(71) Applicant: Infineon Technologies Austria AG, Villach (AT)

(72) Inventors: Ralf Siemieniec, Villach (AT); Michael Hutzler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 404 days.

(21) Appl. No.: 14/081,375

(22) Filed: Nov. 15, 2013

(65) Prior Publication Data

US 2015/0137223 A1 May 21, 2015

(51) Int. Cl.
*H01L 27/088* (2006.01)
*H01L 29/78* (2006.01)
*H01L 29/423* (2006.01)
*H01L 29/739* (2006.01)
*H01L 29/417* (2006.01)
*H01L 29/45* (2006.01)
*H01L 29/40* (2006.01)
*H01L 29/10* (2006.01)

(52) U.S. Cl.
CPC .... *H01L 29/7813* (2013.01); *H01L 29/41766* (2013.01); *H01L 29/4236* (2013.01); *H01L 29/45* (2013.01); *H01L 29/7397* (2013.01); *H01L 29/1095* (2013.01); *H01L 29/407* (2013.01); *H01L 29/42368* (2013.01)

(58) Field of Classification Search
None
See application file for complete search history.

(56) References Cited

U.S. PATENT DOCUMENTS

| 8,247,867 B2* | 8/2012 | Nakata | H01L 29/0696 257/331 |
| 2013/0175605 A1* | 7/2013 | Hirler | H01L 29/407 257/328 |
| 2014/0103426 A1* | 4/2014 | Hsieh | H01L 29/41766 257/330 |
| 2015/0076594 A1* | 3/2015 | Hsieh | H01L 29/0619 257/334 |

* cited by examiner

*Primary Examiner* — Ali Naraghi
(74) *Attorney, Agent, or Firm* — Murphy, Bilak & Homiller, PLLC

(57) ABSTRACT

A transistor component includes a semiconductor body, a first main electrode, a gate contact electrode, a plurality of transistor cells, and a plurality of gate electrodes. The semiconductor body has a drain region and a drift region of a first conduction type, and a body region of a second conduction type. The first main electrode is on a top side of the semiconductor body. The plurality of gate electrodes is electrically connected to the gate contact electrode and arranged successively in a first lateral direction. In the plurality, a first gate electrode is next to a second gate electrode. The first main electrode includes a first trench contact finger, between the first gate electrode and the second gate electrode, and a second trench contact finger, between the first gate electrode and the second gate electrode, electrically connecting the first main electrode to the body region.

25 Claims, 6 Drawing Sheets

TRANSISTOR COMPONENT

TECHNICAL FIELD

Embodiments of the present invention relate to a method for producing a controllable semiconductor component.

BACKGROUND

Controllable semiconductor components like MOSFETs (Metal Oxide Semiconductor Field-Effect Transistors), IGBTs (Insulated Gate Bipolar Transistors) etc. are widely used as electronic switches for switching electrical loads or as electronic switches in all types of switching converters. In such components, a load path between a first main electrode (e.g., a source or emitter) and a second main electrode (e.g., a drain or collector) can be switched "ON" (i.e., the conductive state) or "OFF" (i.e., the blocking state) using an appropriate control signal applied to a control input (gate). In the conductive state, the load path has a low on-state resistance. As a general rule, each new generation of controllable semiconductor components are desired to have a lower area specific on-resistance than the previous generation without deterioration of the switching characteristics. A measure for the overall performance of the component is the $FOM_G$ (Figure of Merit (Gate)), i.e., the product of the on-state resistance $R_{ON}$ and the gate charge $Q_G$. An additional important parameter is the FOMoss (Figure of Merit (output)), i.e. the product of the on-state resistance $R_{ON}$ and the output charge $Q_{oss}$. Lower $FOM_G$ and $FOM_{oss}$, increase the overall performance of the component. A further important development target is high avalanche strength, which is required, for instance, when switching inductive loads.

One target of the development in the past years was to reduce the cell pitch of the component. Thereby, the structures were scaled down with each step in development. However, that concept has been developed close to its limits. Hence, providing a further improved controllable semiconductor component requires a new concept.

SUMMARY

One aspect relates to a transistor component with a semiconductor body. The semiconductor body has a bottom side and a top side that spaced distant from the bottom side in a vertical direction. The semiconductor body has a drain region of a first conduction type, a drift region of the first conduction type, and a body region of a second conduction type that is complementary to the first conduction type. On the top side, a first main electrode is arranged. The transistor component also has a gate contact electrode and a plurality of transistor cells. The transistor component further has a plurality of gate trenches formed in the semiconductor body and arranged successively in a first lateral direction perpendicular to the vertical direction, and a plurality of gate electrodes each arranged in another one of the gate trenches and electrically connected to the gate contact electrode. In the disclosed embodiments, a "gate electrode" is arranged in a gate trench formed in the semiconductor body. In contrast, a "gate contact electrode" is not necessarily arranged in a trench formed in the semiconductor body.

The plurality of gate electrodes includes at least one first gate electrode arranged in a first one of the gate trenches and at least one second gate electrode arranged in a first one of the gate trenches. Among all gate trenches of the transistor, the first gate trench and the second gate trench are nearest neighbors. That is, among all gate trenches of the transistor, there is no other gate trench of the transistor component arranged between the first gate trench and the second gate trench. The first main electrode has a first trench contact finger and a second trench contact finger. Both the first and second trench contact fingers are arranged between the first gate trench and the second gate trench and electrically connect the first main electrode to the body region and/or to the source region. Further, the first trench contact finger is arranged between the first gate electrode and the second gate electrode, and the second trench contact finger is arranged between the first gate electrode and the second gate electrode. In the sense of the present invention, the first main electrode may consist of a homogeneous material, or it may be composed of at least two different materials. In particular, a 'trench contact finger' is not necessarily made of the same material or material composition as the rest of the first main electrode.

A further aspect relates to a transistor component with a semiconductor body. The semiconductor body has a bottom side and a top side spaced distant from the bottom side in a vertical direction. The semiconductor body further has a drain region of a first conduction type, a drift region of the first conduction type, and a body region of a second conduction type that is complementary to the first conduction type. On the top side, a first main electrode is arranged. The transistor component also has a plurality of transistor cells arranged successively in a first lateral direction perpendicular to the vertical direction and having, In the first lateral direction, a cell pitch.

The first main electrode further has a plurality of finger groups. Each of the finger groups has at least two trench contact fingers electrically connecting the first main electrode to the body region. In the first lateral direction, the at least two trench contact fingers of each of the finger groups have a finger pitch that is smaller than the cell pitch.

Still a further aspect relates to a transistor component with a semiconductor body. The semiconductor body has a bottom side and a top side spaced distant from the bottom side in a vertical direction. The semiconductor body further has a drain region of a first conduction type, a drift region of the first conduction type, and a body region of a second conduction type that is complementary to the first conduction type. On the top side, a first main electrode is arranged. The transistor component further has a gate contact electrode. The first main electrode has a total number of trench contact fingers that electrically connect the first main electrode to the body region. Each of the trench contact fingers has a routing direction and, along its routing direction, a finger length. Then, the transistor component has a total number of gate electrodes electrically connected to the gate contact electrode and arranged successively in a first lateral direction perpendicular to the vertical direction. Each of the gate electrodes have a routing direction and, along its routing direction, a gate electrode length. The sum of the finger lengths of all of the total number of trench contact fingers is greater than the sum of the finger lengths of all of the total number of gate electrodes.

Some of the advantages of the presently disclosed embodiments include: In conventional transistors, the sections of the semiconductor body arranged between two adjoining gate trenches are provided with a single source contact finger having a large width in order to avoid the integrated bipolar transistor from being turned on which is equivalent with avoiding a latch-up of the transistor and, accordingly, with a good avalanche behaviour. However, a wide source contact finger requires filling a wide contact finger trench formed in the semiconductor body with electrically conductive material by deposition. For filling, the contact finger trench is usually overfilled so that an electrically conductive layer is formed on the top side. In general, that electrically conductive layer has a depression above the contact finger trench. In deeper depressions, more problems like voids that occur during subsequent lithographic process steps. In contrast, some of the present embodiments use at least two contact fingers per transistor cell. As a consequence, each contact finger can be arranged in an individual, narrow trench leaving only a small depression when being filled with electrically conductive material, in particular as the void formation is reduced.

In the context of the present description, the "total number of trench contact fingers" includes all trench contact fingers of the first main electrode that electrically connect the first main electrode to the body region. Accordingly, "total number of gate electrodes" is intended to include all gate electrodes of the trenches that electrically connect to the gate contact electrode.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
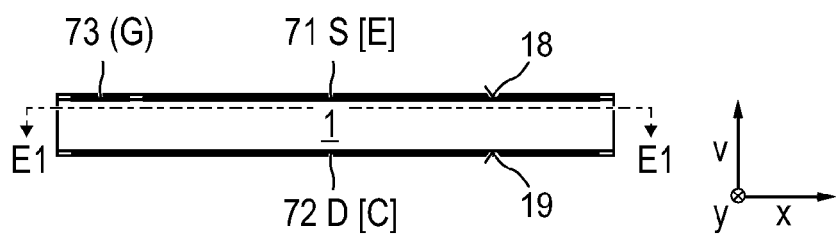
FIG. 1 illustrates a vertical cross-sectional view of a first embodiment of a power transistor.
Figure 2:
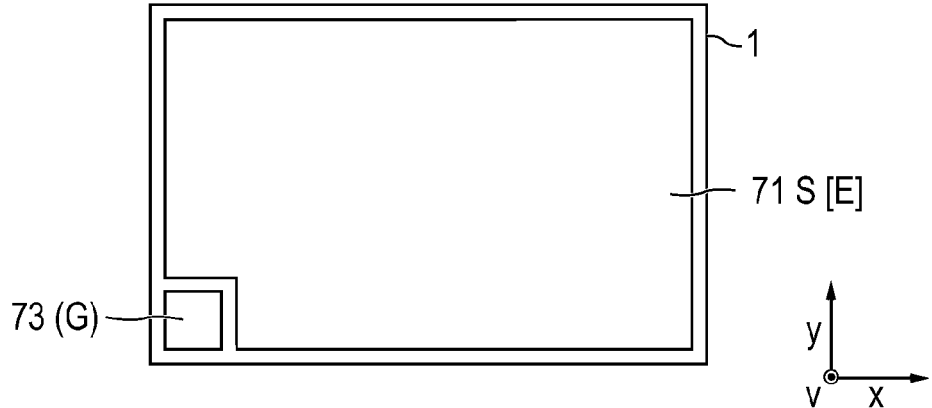
FIG. 2 illustrates a top view of the power transistor of FIG. 1.

FIG. 1 schematically illustrates a vertical cross sectional view of a power transistor. The power transistor has a semiconductor body 1 with a top side 18 and a bottom side 19. The top side 18 is spaced distant from the bottom side in a vertical direction v. The illustrated sectional plane extends perpendicular to the top side 18 and to the bottom side 19. The semiconductor body 1 may be formed from any conventional semiconductor material, such as silicon (Si), silicon carbide (SiC), gallium arsenide (GaAs), or any other semiconductor material.

Starting from the bottom side 19, the semiconductor body 1 may include, arranged on top of one another, a first semiconductor region 11 of a first conduction type, a second semiconductor region 12 of the first conduction type, a third semiconductor region 13 of a second conduction type complementary to the first conduction type, and a fourth semiconductor region 14 of the first or of the second conduction type. The first semiconductor region 11 has a doping concentration significantly greater than a dopant concentration of the second semiconductor region 12, and the fourth semiconductor region 14 has a doping concentration significantly greater than a dopant concentration of the third semiconductor region 13 or the second semiconductor region 12.

The first conduction type is either 'n-conducting' and the second conduction type is 'p-conducting', or the first conduction type is 'p-conducting' and the second conduction type is 'n-conducting'. The first semiconductor region 11 may be a drain region, the second semiconductor region 12 may be a drift region, the third semiconductor region 13 may be a body region and the fourth semiconductor region 14 may be a source region.

In cases where the conduction type of the first semiconductor region 11 is the same as the conduction type of the second semiconductor region 12, the transistor is a conventional field effect transistor, and in cases where the conduction type of the first semiconductor region 11 is complementary to the conduction type of the second semiconductor region 12, the transistor is an IGBT (Insulated Gate Bipolar Transistor). As far as there is a difference between a conventional field effect transistor and an IGBT, in the following drawings the labels valid for an IGBT are indicated in square brackets.

FIGS. 1 to 5 illustrate different views of a first embodiment of a transistor component which exemplarily is a vertical n-channel power field effect transistor, in which the first semiconductor region 11 is a heavily n-doped drain region, the second semiconductor region 12 is a weakly n-doped drift region, the third semiconductor region 13 is a p-doped body region and the fourth semiconductor region 14 is a heavily p-doped body contact region.

The transistor has a first main electrode 71, a second main electrode 72, and a gate contact electrode 73. As illustrated, the electrodes 71, 72, 73 may be exposed so that the transistor component can be electrically connected to other electronic elements, components or devices, for instance by soldering, wire bonding etc. In cases where a first or second main electrode 71, 72 and/or a gate contact electrode 73 also forms a contact pad, the respective electrode is an exposed pad of the completed transistor and allows for electromechanically contacting the transistor. In other embodiments however, one, any two or each of the contact electrodes 71, 72, 73 may be formed as a buried electrodes.

The gate contact electrode 73 serves to control a load path formed between the first main electrode 71 and the second main electrode 72. That is, the load path may be switched "ON" (partly or fully conductive state) or "OFF" (blocking state) via an electric control potential applied to the gate contact electrode 73. In the illustrated embodiments, the first main electrode 71 and the second main electrode 72 are a source (S) electrode and a drain (D) electrode, respectively, or, in case of an IGBT, an emitter (E) electrode and a collector (C) electrode, respectively. In other embodiments, the first main electrode 71 and the second main electrode 72 may be a drain (D) electrode and a source (S) electrode, respectively, or, in case of an IGBT, a collector (C) electrode and an emitter (E) electrode, respectively. As can be seen from the top view of FIG. 2, the first main electrode 71 may cover almost the whole top side 18. Accordingly, the second main electrode 72 may cover almost the whole bottom side 19.

In the illustrated embodiments, both the first main electrode 71 and the gate contact electrode 73 are arranged on the top side 18, and the second main electrode 72 is arranged on the bottom side 19. Alternatively, the both the second main electrode 72 and the gate contact electrode 73 may be arranged on the bottom side 19, and the first main electrode 71 on the top side 18.

Figure 3:
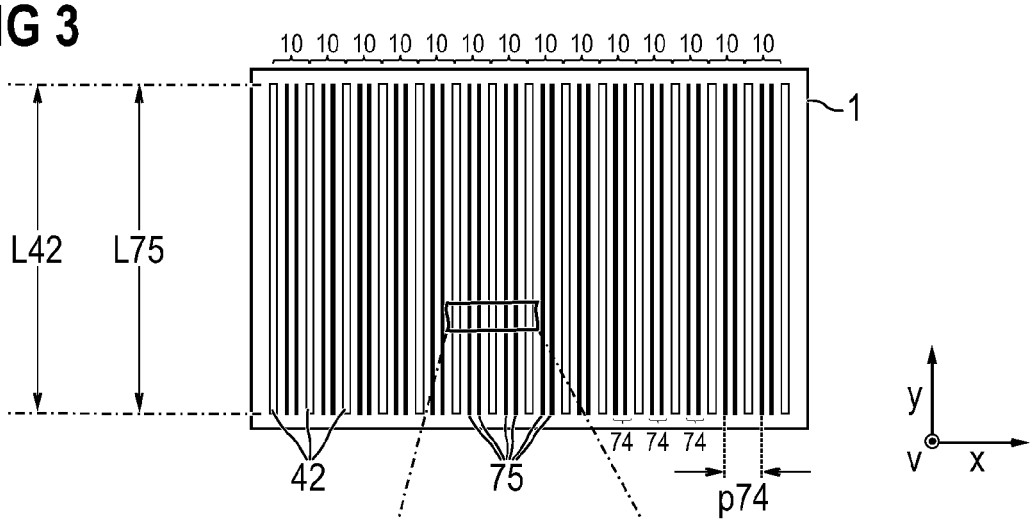
FIG. 3 illustrates a horizontal cross-sectional view of the vertical power transistor of FIG. 1 in a cross-sectional plane E1-E1.

As can be seen from the horizontal cross-sectional view of FIG. 3, the transistor may have a plurality of transistor cells 10. In the present embodiment, the transistor cells 10 are exemplarily formed as stripe cells. Some, or, as shown in the embodiment of FIG. 3, all of the transistor cells 10 may be arranged successively in a first lateral direction x and have a cell pitch p10, wherein the first lateral direction x runs perpendicular to the vertical direction v.

The transistor further has a plurality of gate electrodes 42 electrically connected to the gate contact electrode 73 and arranged successively in the first lateral direction x. Each of the gate electrodes 42 has a routing direction and, along its routing direction, a gate electrode length L42. In the present embodiment, the routing direction runs straight in a second lateral direction y perpendicular to the vertical direction v. Optionally, the second lateral direction y may run perpendicular also to the first lateral direction x. However, the first lateral direction x and the second lateral direction y may also enclose an angle different from 90°.

Alternatively to gate electrodes 42 having a straight routing direction, curved or angled routing directions are also possible. In those cases,—as the length L42 is to be measured along its routing direction—the length L42 of a gate electrode 42 is greater than the distance between the ends of that gate electrode 42.

In FIGS. 4 to 9, some reference numerals (10, 24, 25, 41, 42, 74, 75) designating the same type of element have different indices in order to differentiate between individuals of the same type of element.

Figure 4:
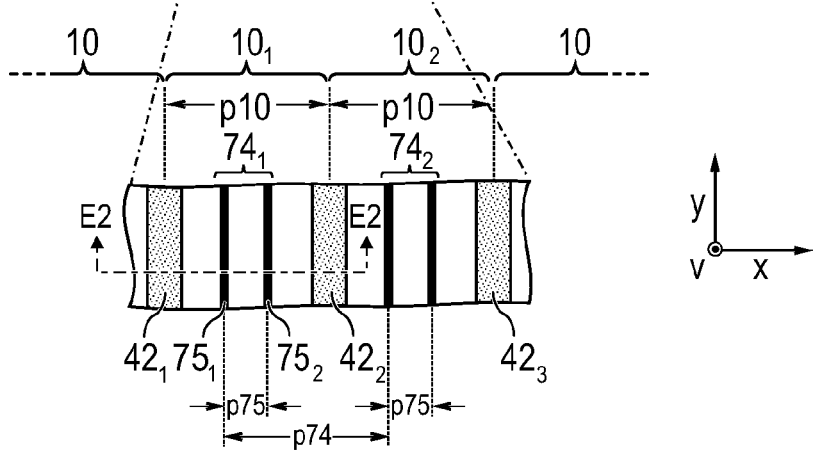
FIG. 4 illustrates an enlarged section of the view of FIG. 3.

As can be seen in more detail from the enlarged section of FIG. 4, a first gate electrode $42_1$ of the plurality of gate electrodes 42 and a second gate electrode $42_2$ of the plurality of gate electrodes 42 are arranged successively in the first lateral direction x. That is, in the first lateral direction x the transistor has no further electrode that is arranged between the first gate electrode $42_1$ and the second gate electrode $42_2$. In other words, among all gate electrodes 42 of the transistor, the second gate electrode $42_2$ is—in the first lateral direction x—that one next to the first gate electrode $42_1$. Accordingly, a third gate electrode $42_3$ is—in the first lateral direction x—that one next to the second gate electrode $42_2$.

As the transistor requires the first main electrode 71 to be electrically connected to the body region 13, the first main electrode 71 has a plurality of trench contact fingers 75 that extend toward the bottom side 19 into trenches formed in the semiconductor body 1. From FIG. 3, which illustrates the plurality of trench contact fingers 75, it can be seen that the trench contact fingers 75 are arranged in finger groups 74 with at least two trench contact fingers 75 each. Each of the finger groups 74 is arranged between two gate electrodes 74 that are arranged contiguously in the first lateral direction x. The finger groups 74 may have, in the first lateral direction x, a group pitch p74. Optionally, the group pitch p74 may be identical to the cell pitch p10.

With regard to the subsequent drawings it is to be noted that some of the reference numerals (e.g. 10, 41, 42, 74, 75) designating the same kind of element (e.g. transistor cell, first gate electrode, second gate electrode, finger group, trench contact finger) are provided with subscripted indices in order to facilitate distinguishing different individuals of the same kind of element.

As can be seen from the enlarged section of FIG. 4, a first finger group $74_1$ of the finger groups 74 with at least two trench contact fingers $75_1$ and $75_2$ is, in the first lateral direction x, arranged between a first gate electrode $42_1$ of all gate electrodes 42 of the transistor and a second gate electrode $42_2$ of all gate electrodes 42 of the transistor. Thereby, the second gate electrode $42_2$ is that one among all gate electrodes 42 of the transistor that is, in the first lateral direction x, arranged next to the first gate electrode $42_1$. As can also be seen from FIG. 4, the trench contact fingers $75_1$, $75_2$ of a finger group 74, may have, in the first lateral direction x, a finger pitch p75.

The finger pitch p75 is smaller than the cell pitch p10 and smaller than the group pitch p74. For instance, the finger pitch p75 may be less than half the cell pitch p10, and/or less than half the group pitch p74.

Figure 5:
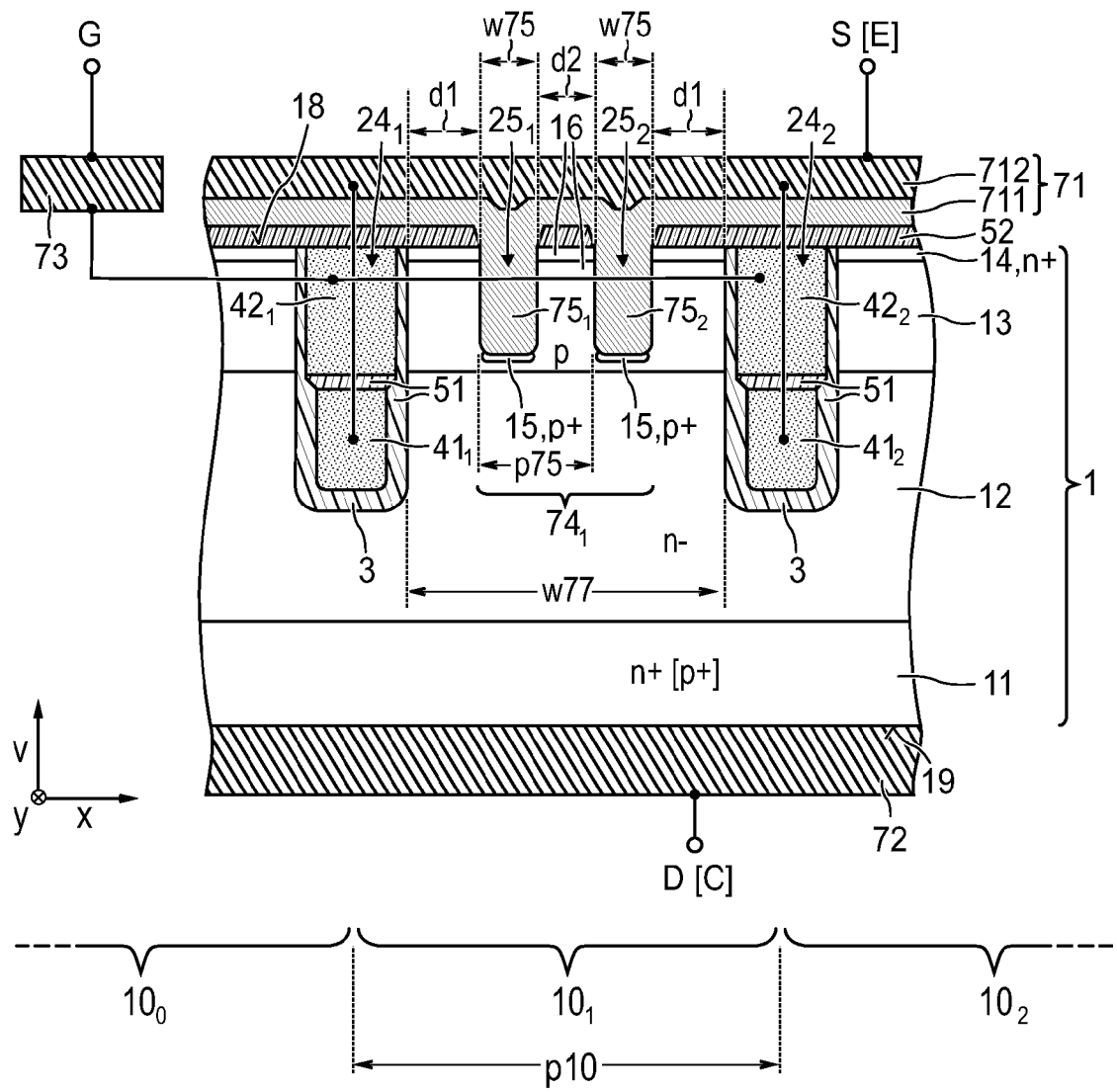
FIG. 5 illustrates a vertical cross-sectional view of a section of the power transistor of FIG. 4 in a cross-sectional plane E2-E2.

Referring now to FIG. 5, there is also illustrated that the at least two trench contact fingers $75_1$, $75_2$ of a finger group $74_1$ are, in the first lateral direction x, arranged between a first gate electrode $42_1$ and a second gate electrode $42_2$ that is arranged, in the first lateral direction x, contiguous to the first gate electrode $42_1$. Between two adjoining trench contact fingers $75_1$, $75_2$ of the same finger group $74_1$, a section 16 of the semiconductor body 1 is arranged. In the present embodiment, the sections 16 comprise a section of the source region 14 and a section of the body region 13.

In order to improve the electrical contact between the trench contact fingers $75_1$, $75_2$ and the body region 13, body contact regions 15 may optionally be provided. To this, each of the body contact regions 15 has a doping concentration higher than a doping concentration of the body region 13. Each of the body contact regions 15 contacts both the body region 13 and one of the trench contact fingers $75_1$, $75_2$. Further, each of the trench contact fingers $75_1$, $75_2$ may have a side wall contacting the source region 14.

By taking the example of the gate electrodes $42_1$, $42_2$, it is also illustrated in FIG. 5 that all gate electrodes 42 of the transistor may be electrically connected to the gate contact electrode 73. The respective electrical connection lines are depicted schematically only. Further, a dielectric 51 electrically insulates the gate electrodes $42_1$, $42_2$ from the semiconductor body 1.

Optional, a transistor according to the present invention may have a plurality of field electrodes $41_1$, $41_2$ which are electrically connected to the first main electrode 71. The respective electrical connection lines are depicted schematically only. Each of the field electrodes $41_1$, $41_2$ is arranged underneath one of the gate electrodes $42_1$, $42_2$ between the respective gate electrode $42_1$, $42_2$ and the bottom side 19. The dielectric 51 electrically insulates also the gate electrodes $42_1$, $42_2$ from the field electrodes $41_1$, $41_2$. The dielectric 51 may be composed of different dielectrics and/or be formed in contiguous production steps.

The first main electrode 71 may be formed from any electrically conductive material, or from any combination of electrically conductive materials. Suitable materials are, for instance, metals or metal alloys, for instance consisting of or comprising one of: Cu; AlCu; AlSiCu. Optionally, the first main electrode 71 may have a layered structure with two or more electrically conductive layers 711, 712. In the embodiment of FIG. 5, an optional, electrically conductive intermediate layer 711 is arranged between a top layer 712 and the semiconductor body 1. The intermediate layer 711 may assume one or more functions.

As an optional first function, the intermediate layer 711 may serve to avoid or suppress a diffusion of a metal of the top layer 712 into the semiconductor body. For instance, the top layer 712 may consist of or comprise copper or aluminum or an alloy with copper and aluminum. If there is copper comprised in the top layer 712, using an intermediate layer 711 with barrier function is preferred as a diffusion of copper into the semiconductor body 1 may adversely affect the operation of the transistor.

As an optional second function, the intermediate layer 711 may improve the adhesion between the electrically top layer 712 and the semiconductor body 1 and/or between the top layer 712 and a dielectric 52 that is arranged on the top side 18 and that electrically insulates the gate electrodes $42_1$, $42_2$ from the first main electrode 71.

Figure 6:
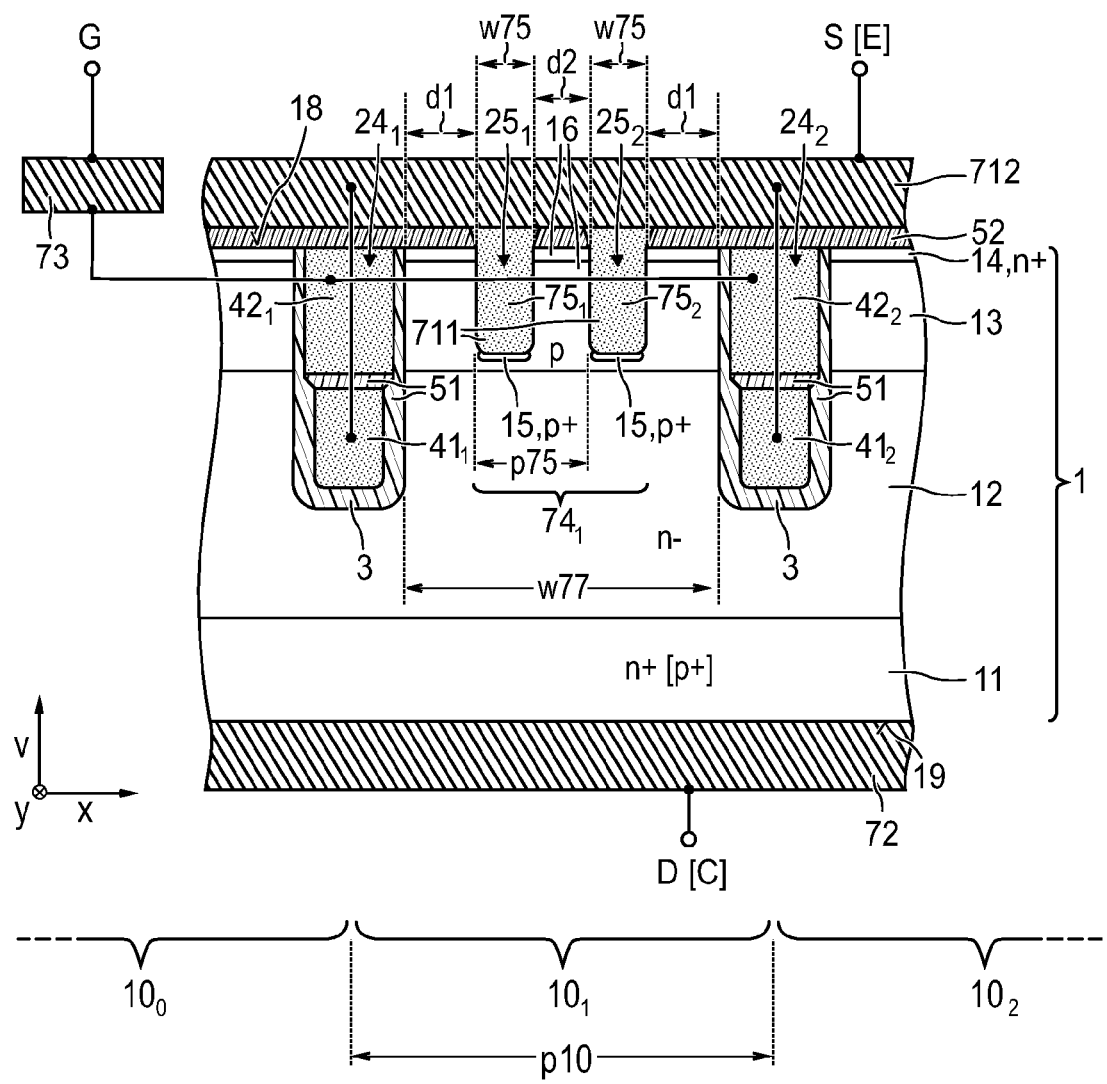
FIG. 6 illustrates a vertical cross-sectional view of a power transistor having trench contact fingers comprising polycrystalline semiconductor material.

The intermediate layer 711 may comprise one or more electrically conductive layers each consisting of a homogeneous material (including homogeneous mixtures of two or more different materials). Suitable homogeneous materials are, for instance, tungsten (W), titanium (Ti), titanium nitride (TiN). According to one embodiment, the intermediate layer 711 may comprise a titanium (Ti) layer arranged between the semiconductor body 1 and the top layer 712, a titanium nitride (TiN) layer arranged between the titanium (Ti) layer and the top layer 712, a titanium nitride (TiN), and a tungsten (W) layer arranged between the titanium nitride (TiN) layer and the top layer 712. As illustrated with reference to FIG. 6, the intermediate layer 711 may also consist of or comprise electrically active doped polycrystalline semiconductor material, for instance, electrically active doped polycrystalline silicon. That is, the trench contact fingers $75_1$, $75_2$ consist of or comprise electrically active doped polycrystalline semiconductor material, for instance electrically active doped polycrystalline silicon. In all other respects, the transistor of FIG. 6 is identical to a transistor as described with reference to the previous Figures. The electrically conductive layer 712 may consist of or comprise in particular of metal, for instance one of the metals mentioned above with reference to FIG. 5.

Figure 7:
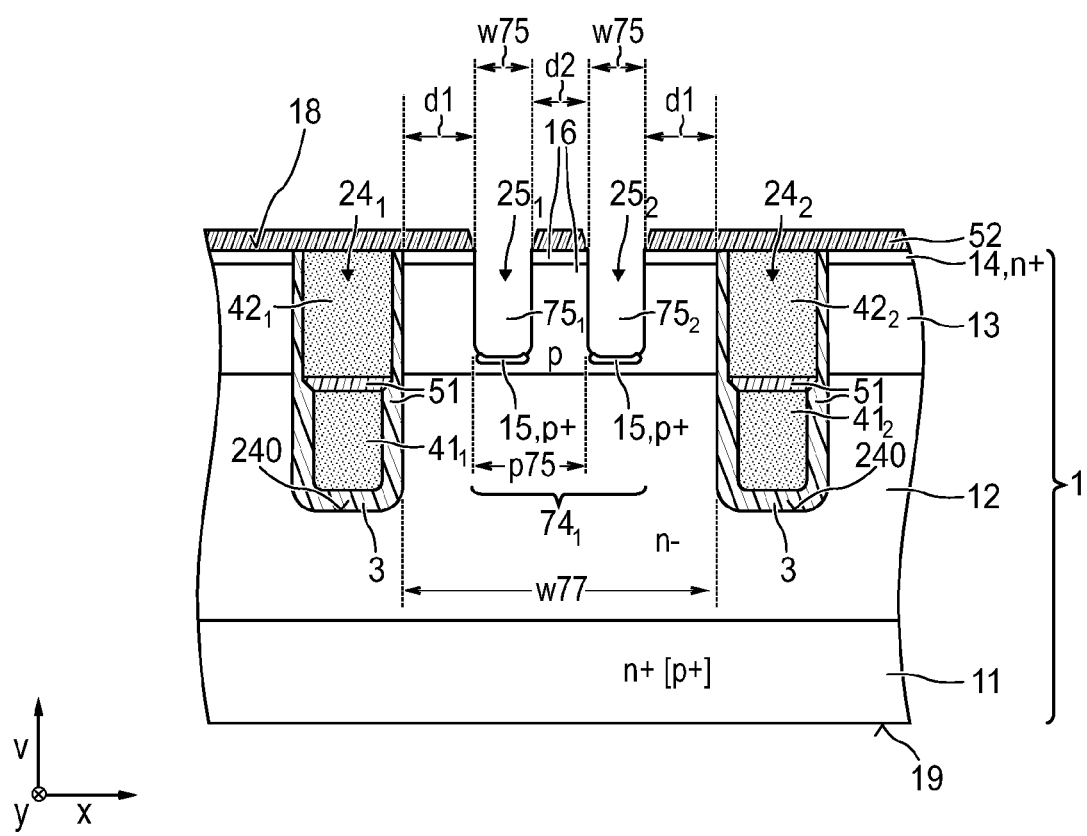
FIG. 7 illustrates the semiconductor body of the power transistor of FIG. 5 during the production of the power transistor.
Figure 7:
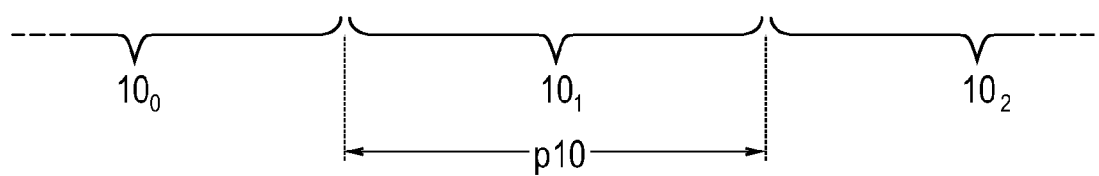

FIG. 7 illustrates the transistor of FIG. 5 during its production prior to forming the main electrodes 71, 72 and the trench contact fingers $75_1$, $75_2$. Starting from a semiconductor body 1 having a substantially even top side 18, gate electrode trenches $24_1$, $24_2$ (already filled in FIG. 7) and contact finger trenches $25_1$, $25_2$ are produced. Each of the trenches $24_1$, $24_2$, $25_1$, $25_2$ extends from the top side 18 towards the bottom side 19 into the semiconductor body 1.

The gate electrodes $42_1$, $42_2$, and, optionally, also the field electrodes $41_1$, $41_2$ are arranged in the gate electrode trenches $24_1$ and $24_2$, respectively. The dielectric 51 may be formed by depositing a dielectric material in the trenches $24_1$ and $24_2$ and/or by oxidizing in the gate electrode trenches $24_1$ and $24_2$ a surface layer of the semiconductor body 1. The contact finger trenches $25_1$ and $25_2$ serve to receive the trench contact fingers $75_1$, $75_2$. Optionally, in each of the gate electrode trenches $24_1$ and $24_2$ one and only one of the gate electrodes $42_1$, $42_2$, may be arranged. Also optionally, in each of the gate electrode trenches $24_1$ and $24_2$ one and only one of the field electrodes $41_1$, $41_2$ may be arranged.

The gate electrode trenches $24_1$, $24_2$ on the one hand and the contact finger trenches $25_1$, $25_2$ on the other hand may be produced simultaneously, for instance in a common etching step, or subsequently in different process steps.

Figure 8:
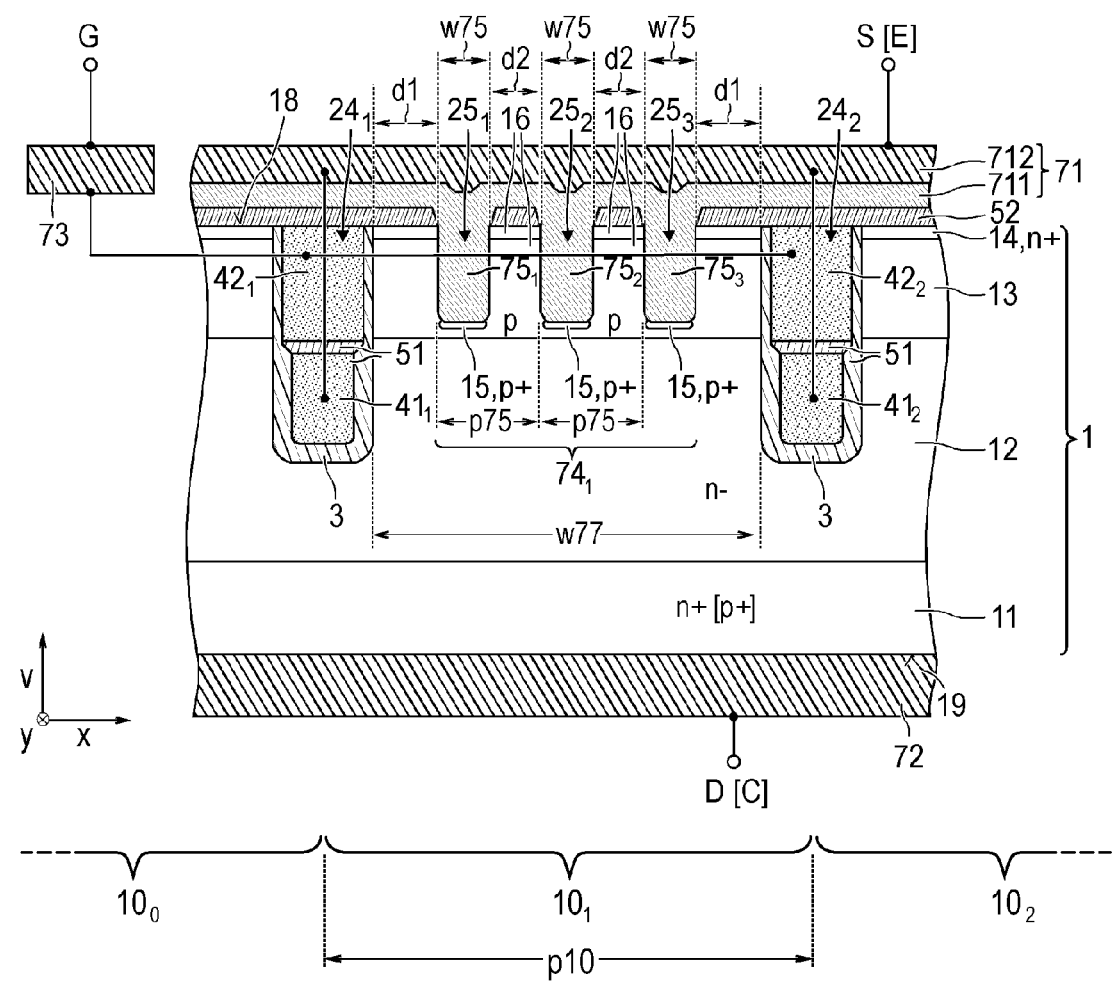
FIG. 8 illustrates a vertical cross-sectional view of a second embodiment of a power transistor.

As explained above, each finger group $74_1$ has at least two trench contact fingers $75_1$, $75_2$. An example for a transistor having finger groups $74_1$ with three trench contact fingers $75_1$, $75_2$, $75_3$ is illustrated in FIG. 8. In other respects, the transistor of FIG. 8 may have the same structure and/or may be produced in the same manner as the transistor explained with reference to FIGS. 1 to 7.

Apart from the marginal area of the transistor, each of the transistor cells 10 has at least one finger group 74 with at least two trench contact fingers 75 each. Because there are a large number of transistor cells 10, the ratio between all trench contact fingers 75 of the transistor and all transistor cells 10 of the transistor is at least about 2. For instance, that ratio may be at least 1.9.

Similarly, the sum of the finger lengths L75 of all trench contact fingers 75 of the transistor may be greater than the sum of the finger lengths L42 of all gate electrodes 42 of the transistor. For instance, the ratio between the sum of the finger lengths L75 of all trench contact fingers 75 of the transistor and the sum of the finger lengths L42 of all gate electrodes 42 of the transistor may be at least 1.9.

Figure 9:
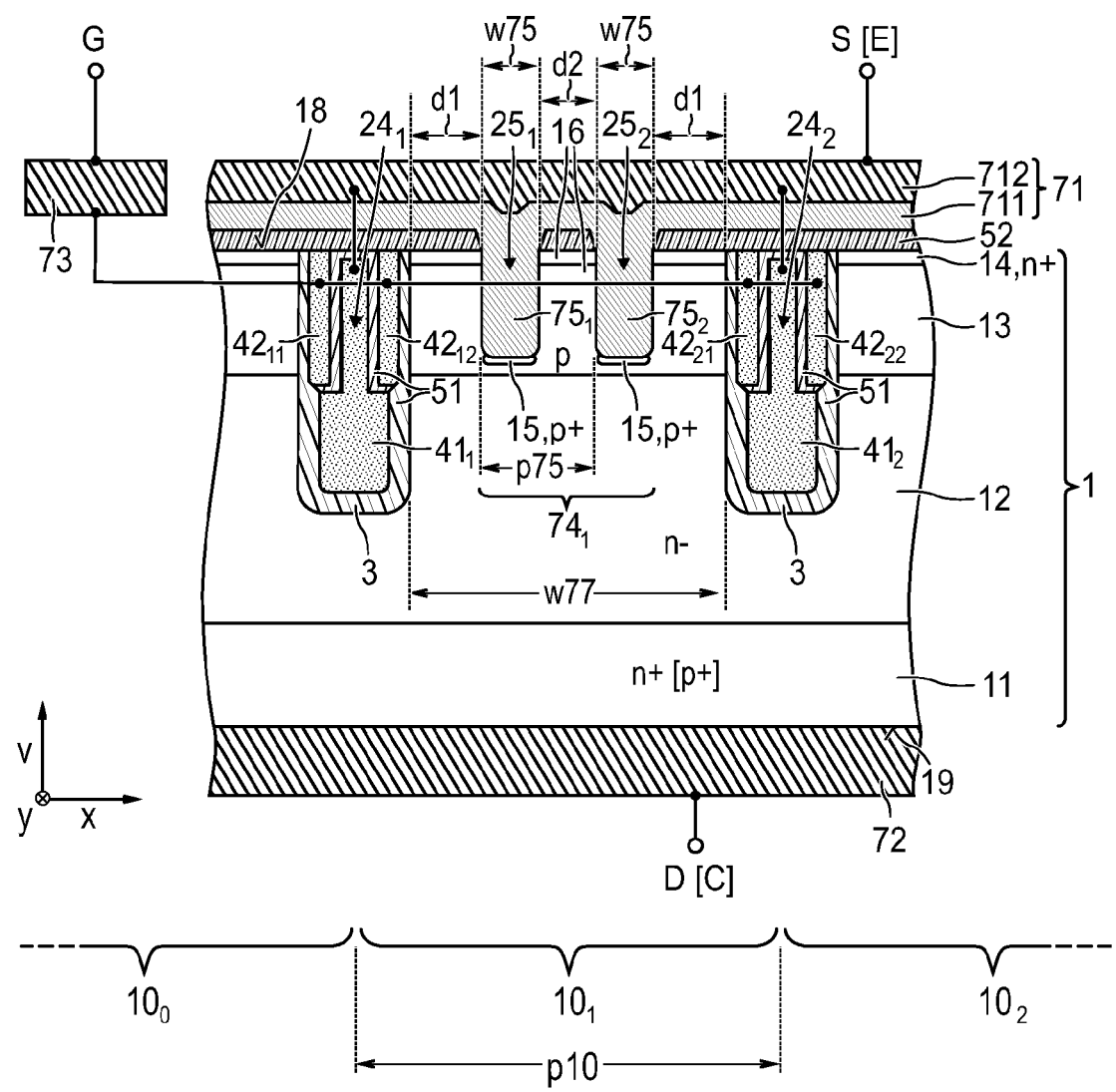
FIG. 9 illustrates a vertical cross-sectional view of a third embodiment of a power transistor with two gate electrodes arranged in a common gate trench.

FIG. 9 illustrates a further embodiment of a power transistor that differs from the power transistor described with reference to FIG. 9 in that there is a pair ($42_{11}$, $42_{12}$), ($42_{21}$, $42_{22}$) of gate electrodes $42_{11}$, $42_{12}$, $42_{21}$, $42_{22}$ arranged in each of the gate trenches $24_1$, $24_2$. Providing two gate electrodes $42_{11}$, $42_{12}$, $42_{21}$, $42_{22}$ in each of the gate trenches $24_1$, $24_2$ allows for laying a section of the field electrode $41_1$, $41_2$ arranged in the same gate trench $24_1$, $24_2$ between the gate electrodes $42_{11}$, $42_{12}$, $42_{21}$, $42_{22}$ towards the first main electrode 71 so as to facilitate the electrical connection between that field electrode $41_1$, $41_2$ and the first main electrode 71.

Again, a finger group 74 with at least two trench contact fingers $75_1$ and $75_2$ is arranged between two adjoining (nearest) gate trenches $24_1$, $24_2$.

Referring again to FIGS. 5 to 9, the following dimensions have been found to be advantageous:
(a) A first distance d1 of a finger group $74_1$, in the first lateral direction x, from the closest one of the gate trenches $24_1$ and $24_2$, between which the respective finger group $74_1$ is arranged, may be at least 100 nm.
(b) A second distance d2 between two contiguously arranged trench contact fingers $75_1$/$75_2$ or $75_2$/$75_3$ of the same finger group 74 may be less than or equal to the first distance d1.
(c) One, more than one, or all of the trench contact fingers $75_1$, $75_2$, $75_3$ may have, in the first lateral direction x, a width w75 of less than 400 nm.

In principle, however, one, any two or all of the dimensions mentioned in the above paragraphs (a), (b) and (c) may be outside the given range.

In all embodiments of the invention relating to a transistor device as described above, the doping concentrations of the first semiconductor region 11 and the fourth semiconductor region 14 may be, for instance, in a range of between $10^{19}$ cm$^{-3}$ and $10^{21}$ cm$^{-3}$. The doping concentration of the drift region 12 may be, for instance, in a range of between $10^{13}$ cm$^{-3}$ and $2 \cdot 10^{17}$ cm$^{-3}$, and the doping concentration of the body region 13 may be, for instance, in a range of between $10^{16}$ cm$^{-3}$ and $10^{18}$ cm$^{-3}$.

In the embodiments described above, the components are field effect transistors, for instance IGFETs (Insulated Gate Field Effect Transistors), MOSFETs (Metal Oxide Field Effect Transistors) or IGBTs (Insulated Gate Bipolar Transistors). However, the explained principles also apply to other transistor components. Instead of the described (vertical) n-channel components, also (vertical) p-channel components may be designed in the same manner. To this, the doping of the first, second, third and fourth semiconductor regions 11, 12, 13, 14 and of the contact doping region 15 need to be inverted, that is, an n-doping is to be replaced by a p-doping and a p-doping is to be replaced by an n-doping.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Expressions like "subsequently," "then," "following" etc. used in the above specification are only intended to express that a certain step is carried out later than a previous step. Nevertheless, one or more additional steps may be carried out after the previous step and prior to the certain step.

The invention claimed is:

1. A transistor component comprising:
    a semiconductor body comprising, between a bottom side and a top side spaced distant from the bottom side in a vertical direction:
        a drain region;
        a drift region of a first conduction type;
        a body region of a second conduction type complementary to the first conduction type;
    a first main electrode arranged on the top side;
    a gate contact electrode;
    a plurality of transistor cells;
    a plurality of gate trenches formed in the semiconductor body and arranged successively in a first lateral direction perpendicular to the vertical direction; and
    a plurality of gate electrodes each arranged in another one of the gate trenches and electrically connected to the gate contact electrode;
    wherein
    the plurality of gate electrodes comprises at least one first gate electrode arranged in a first one of the gate trenches and at least one second gate electrode arranged in a second one of the gate trenches;
    among all gate trenches of the transistor, a first gate trench and a second gate trench are nearest neighbors;
    the first main electrode comprises a first trench contact finger and a second trench contact finger both arranged between the first gate trench and the second gate trench and electrically connecting the first main electrode to the body region;
    wherein a section of a source region is arranged between the first trench contact finger and the second trench contact finger.

2. The transistor component of claim 1, wherein a section of the body region is arranged between the first trench contact finger and the second trench contact finger.

3. The transistor component as claimed in claim 1 comprising at least one of:
    a first contact finger trench extending from the top side into the semiconductor body, wherein the first trench contact finger is arranged in the first contact finger trench;
    a second contact finger trench extending from the top side into the semiconductor body, wherein the second trench contact finger is arranged in the second contact finger trench.

4. The transistor component of claim 1 comprising a gate dielectric arranged between the first gate electrode and the semiconductor body, wherein a distance between the first trench contact finger and the second trench contact finger in the first lateral direction is less than or equal to a distance between the first trench contact finger and the gate trench in the first lateral direction.

5. The transistor component of claim 1 comprising a gate dielectric arranged between the first gate electrode and the semiconductor body, wherein a distance between the first trench contact finger and the gate dielectric in the first lateral direction is at least 100 nm.

6. The transistor component of claim 1, comprising at least one of:
    a first trench contact finger width of less than 400 nm in a first lateral direction; and
    a second trench contact finger width of less than 400 nm in a first lateral direction.

7. The transistor component of claim 1, wherein
    the plurality of transistor cells has, in a first lateral direction, a cell pitch; and
    the first trench contact finger and the second trench contact finger have, in the first lateral direction, a trench contact finger pitch smaller than the cell pitch.

8. The transistor component of claim 7, wherein the trench contact finger pitch is less than half the cell pitch.

9. The transistor component of claim 8 wherein the plurality of transistor cells are formed as stripe cells.

10. The transistor component of claim 9 wherein the stripe cells extend in a second lateral direction running perpendicular to both the vertical direction and the first lateral direction.

11. The transistor component of claim 1, wherein:
    each of the plurality of gate electrode trenches extends from the top side into the semiconductor body; and
    in each of the gate electrode trenches only one of the gate electrodes is arranged.

12. The transistor component of claim 11, comprising a plurality of field electrodes each electrically connected to the first main electrode, wherein each of the gate electrode trenches only one of the field electrodes is arranged between the bottom side and the gate electrode arranged in the same gate electrode trench.

13. A transistor component comprising:
    a semiconductor body comprising, between a bottom side and a top side spaced distant from the bottom side in a vertical direction:
        a drain region;
        a drift region of a first conduction type;
        a body region of a second conduction type complementary to the first conduction type;
    a first main electrode arranged on the top side; and
    a plurality of transistor cells arranged successively in a first lateral direction perpendicular to the vertical direction and comprising, in the first lateral direction, a cell pitch; wherein
    the first main electrode comprises a plurality of finger groups, each of the finger groups comprising at least two trench contact fingers electrically connecting the first main electrode to the body region;
    the at least two trench contact fingers of each of the finger groups comprise, in the first lateral direction, a trench contact finger pitch smaller than the cell pitch, wherein a section of a source region is arranged between the first trench contact finger and the second trench contact finger.

14. The transistor component of claim 13, comprising a total number of transistor cells and a total number of trench contact fingers, wherein the ratio between the total number of trench contact fingers and the total number of transistor cells is at least 1.9.

15. The transistor component of claim 13, wherein the trench contact finger pitch is less than half the cell pitch.

16. The transistor component of claim 13, wherein the plurality of finger groups comprises, in the first lateral direction, a group pitch equal to the cell pitch.

17. The transistor component of claim 13, wherein each of the transistor cells comprises at least two of the trench contact fingers.

18. The transistor component of claim 13 comprising a gate dielectric arranged between the first gate electrode and the semiconductor body, wherein a distance between two adjoining trench contact fingers of one of the finger groups in the first lateral direction is less than or equal to a distance between that finger group and the gate dielectric in the first lateral direction.

19. The transistor component of claim 13 comprising a gate dielectric arranged between the first gate electrode and the semiconductor body, wherein a distance between the finger group and the gate dielectric in the first lateral direction is at least 100 nm.

20. The transistor component of claim 13, wherein each of the trench contact fingers has, in the first lateral direction, a width of less than 400 nm.

21. The transistor component of claim 13 comprising
a gate contact electrode;
a plurality of gate electrodes electrically connected to the gate contact electrode; and
a plurality of gate electrode trenches each extending from the top side into the semiconductor body, wherein, in each of the gate electrode trenches, only one of the gate electrodes is arranged.

22. The transistor component of claim 21 comprising a plurality of field electrodes each electrically connected to the first main electrode, wherein in each of the gate electrode trenches only one of the field electrodes is arranged between the bottom side and the gate electrode arranged in the same gate electrode trench.

23. A transistor component, comprising:
a semiconductor body comprising, between a bottom side and a top side spaced distant from the bottom side in a vertical direction:
a drain region;
a drift region of a first conduction type;
a body region of a second conduction type complementary to the first conduction type;
a first main electrode arranged on the top side, the first main electrode comprising a total number of trench contact fingers electrically connecting the first main electrode to the body region, each of the trench contact fingers comprising a routing direction and, along its routing direction, a finger length;
a gate contact electrode;
a total number of gate electrodes electrically connected to the gate electrode and arranged successively in a first lateral direction perpendicular to the vertical direction, each of the gate electrodes comprising a routing direction and, along its routing direction, a gate electrode length; wherein
the sum of the gate electrode lengths of all of the total number of trench contact fingers is greater than the sum of the finger lengths of all of the total number of gate electrodes; and
wherein a section of a source region is arranged between the first trench contact finger and the second trench contact finger.

24. The transistor component of claim 23, wherein
the ratio between the sum of the finger lengths of all of the total number of trench contact fingers and the sum of the finger lengths of all of the total number of gate electrodes is at least 1.9.

25. The transistor component of claim 23, wherein each of the trench contact fingers has, in the first la al direction, a width of less than 400 nm.

* * * * *

UNITED STATES PATENT AND TRADEMARK OFFICE
CERTIFICATE OF CORRECTION

PATENT NO. : 9,653,598 B2  
APPLICATION NO. : 14/081375  
DATED : May 16, 2017  
INVENTOR(S) : R. Siemieniec et al.

Page 1 of 1

It is certified that error appears in the above-identified patent and that said Letters Patent is hereby corrected as shown below:

In the Claims

Column 12, Line 39 (Claim 25, Line 2) please change "first la al" to -- first lateral --

Signed and Sealed this  
Eleventh Day of July, 2017

Joseph Matal  
*Performing the Functions and Duties of the*  
*Under Secretary of Commerce for Intellectual Property and*  
*Director of the United States Patent and Trademark Office*